United States Patent
Villa et al.

(10) Patent No.: US 7,846,811 B2
(45) Date of Patent: Dec. 7, 2010

(54) PROCESS FOR MANUFACTURING A HIGH-QUALITY SOI WAFER

(75) Inventors: Flavio Francesco Villa, Milan (IT); Pietro Corona, Milan (IT); Gabriele Barlocchi, Cornaredo (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 892 days.

(21) Appl. No.: 11/448,589

(22) Filed: Jun. 6, 2006

(65) Prior Publication Data
US 2007/0042558 A1 Feb. 22, 2007

(30) Foreign Application Priority Data
Jun. 6, 2005 (EP) .................... 05425406

(51) Int. Cl.
*H01L 21/76* (2006.01)
(52) U.S. Cl. ...................... 438/424; 438/400
(58) Field of Classification Search ............... 438/400, 438/411, 422, 424; 257/E21.54
See application file for complete search history.

(56) References Cited

U.S. PATENT DOCUMENTS

| | | | | |
|---|---|---|---|---|
| 4,888,300 | A * | 12/1989 | Burton | 438/404 |
| 5,438,015 | A | 8/1995 | Lur et al. | |
| 6,773,616 | B1 | 8/2004 | Chen et al. | |
| 7,235,456 | B2 * | 6/2007 | Sato et al. | 438/411 |
| 7,294,536 | B2 * | 11/2007 | Villa et al. | 438/149 |
| 7,491,286 | B2 * | 2/2009 | Kagan et al. | 156/230 |
| 2003/0168711 | A1 * | 9/2003 | Villa et al. | 257/506 |
| 2003/0209814 | A1 * | 11/2003 | Farrar et al. | 257/797 |
| 2005/0037593 | A1 | 2/2005 | Delpech et al. | |
| 2005/0227492 | A1 * | 10/2005 | Hah et al. | 438/696 |

FOREIGN PATENT DOCUMENTS

EP 0 223 694 A2 5/1987

(Continued)

OTHER PUBLICATIONS

K. W. Guarini, et al., "Process integration of self-assembled polymer templates into silicon nanofabrication", J. Vac. Sci. Technol. B 20(6), Nov./Dec. 2002, pp. 2788-2792.

(Continued)

*Primary Examiner*—Bradley K Smith
(74) *Attorney, Agent, or Firm*—Lisa K. Jorgenson; Kevin D. Jablonski; Graybeal Jackson LLP

(57) ABSTRACT

In a process for manufacturing a SOI wafer, the following steps are envisaged: forming, in a monolithic body of semiconductor material having a front face, a buried cavity, which extends at a distance from the front face and delimits, with the front face, a surface region of the monolithic body, the surface region being surrounded by a bulk region and forming a flexible membrane suspended above the buried cavity; forming, through the monolithic body, at least one access passage, which reaches the buried cavity; and filling the buried cavity uniformly with an insulating region. The surface region is continuous and formed by a single portion of semiconductor material, and the buried cavity is contained and completely insulated within the monolithic body; the step of forming at least one access passage is performed after the step of forming a buried cavity.

30 Claims, 5 Drawing Sheets

FOREIGN PATENT DOCUMENTS

| | | |
|---|---|---|
| EP | 0 957 515 A1 | 11/1999 |
| EP | 1 073 112 A | 1/2001 |
| EP | 1 324 382 A1 | 7/2003 |
| EP | 1577656 | 9/2005 |
| JP | 57 160142 A | 10/1982 |
| WO | WO 02/078061 A2 | 10/2002 |

OTHER PUBLICATIONS

European Search Report for 05425406 dated Sep. 7, 2005.

* cited by examiner

US 7,846,811 B2

PROCESS FOR MANUFACTURING A HIGH-QUALITY SOI WAFER

PRIORITY CLAIM

This application claims priority from European patent application No. 05425406.5, filed Jun. 6, 2005, which is incorporated herein by reference.

TECHNICAL FIELD

An embodiment of the present invention relates to a process for manufacturing a high-quality wafer of semiconductor-on-insulator material (SOI—Silicon On Insulator).

BACKGROUND

From commonly assigned patent application No. EP-A-1 324 382, which is incorporated by reference, a process is known for the manufacturing of SOI wafers by annealing and oxidation of buried channels. Said process is described briefly with reference to FIGS. 1-5.

In an initial step (FIG. 1), deep trenches 3 are formed in a silicon wafer 1 comprising a substrate 2, by means of an anisotropic etching through an appropriately shaped resist mask 4. In particular, the deep trenches 3 have a substantially rectilinear shape, extend parallel to one another, and are separated by silicon walls 5.

Next (FIG. 2), the resist mask 4 is removed and, via an epitaxial growth, a surface layer 6 of silicon is formed, closing at the top the deep trenches 3 to form a plurality of buried channels 7. Before the deep trenches 3 are closed at the top, a growth of silicon also occurs within them, causing a reduction in their dimensions. At the end of the epitaxial growth, the buried channels 7 consequently have an oval cross section elongated in a direction perpendicular to the surface of the wafer 1.

Then (FIG. 3), a thermal annealing is performed, which causes a migration of part of the silicon atoms of the walls 5 surrounding the buried channels 7, which move to a lower energy state. At the end of the annealing step, the buried channels 7 assume an approximately circular cross section, and the walls 5 thin out.

Next (FIG. 4), the wafer 1 is etched from the front to form a connection trench 8, having a depth and a size such as to reach all the buried channels 7. In particular, the connection trench 8 extends along a closed line delimiting an active area 9 of the surface layer 6, wherein integrated components are subsequently formed (active area of the SOI wafer). Oxygen is then supplied through the connection trench 8 during a step of thermal oxidation so as to oxidize completely the walls 5 and the portions of silicon that surround the buried channels 7, and partially the internal walls of the connection trench 8 and the buried channels 7. An insulating region 10 is thus formed, which electrically separates the active area 9 from the substrate 2 and forms the buried-oxide layer of the SOI wafer (FIG. 5). Finally, a layer of TEOS (TetraEthylOrthoSilicate) oxide can be deposited on the wafer 1 so as to fill the connection trench 8 and the buried channels 7 and form, with the insulating region 10, a single insulating structure.

The above process involves considerably lower costs as compared to traditional type processes. Furthermore, it has the advantages of enabling almost complete elimination of low-frequency parasitics, which are responsible for approximately 90% of the active silicon layer failures, and substrate gettering, thus ensuring a good quality of gate oxides (for CMOS or DMOS devices).

However, said process may also have some drawbacks.

In the first place, SOI wafers thus formed may have a higher thermal resistance ($R_{th}$) than SOI wafers formed with traditional type manufacturing processes: for example, it may be shown that the DC thermal resistance of a power LDMOS integrated in the SOI wafer active area undergoes an increase of approximately 25% as compared to the thermal resistance of a power LDMOS integrated in a traditional type SOI wafer. This is principally due to the presence, within the buried-oxide layer, of empty areas or voids set at regular intervals apart and not filled with dielectric material. In particular, empty areas can also remain even if filling with TEOS has been performed.

The buried-oxide layer moreover has undulations (FIG. 5) at the interface with the silicon, which may further reduce the quality of the SOI wafer as far as electrical characteristics are concerned.

Furthermore, the thickness of the buried-oxide layer formed through said process may be excessively high for normal (i.e., non-power) applications.

To reduce some of said problems, and in particular to eliminate the empty areas within the buried-oxide layer, it has been proposed to prolong the step of oxidation (pronounced oxidation) and to use shallower trenches. Furthermore, it has been proposed to act on the ratio width/depth of the trenches to reduce both the thickness of the buried-oxide layer and the undulations at the interface with the silicon. Said solutions have, however, proven not altogether satisfactory both because they may not provide a total reduction of the empty areas within the buried-oxide layer, and because the pronounced oxidation may cause stress in the adjacent silicon regions, which can lead to crystallographic defects (in the form of dislocations).

SUMMARY

An embodiment of the present invention is a process for manufacturing SOI wafers that overcomes the aforesaid disadvantages and problems and, in particular, that forms high-quality SOI wafers.

BRIEF DESCRIPTION OF THE DRAWINGS

For a better understanding of the present invention, embodiments thereof are now described purely by way of non-limiting example and with reference to the attached drawings.

DETAILED DESCRIPTION

Embodiments of a process for manufacturing a SOI wafer are now described. Said process is based, in part, upon the process described in commonly assigned European patent application No. 04 425 197.3, which was filed on Mar. 19, 2004 and which is incorporated by reference.

Figure 1:
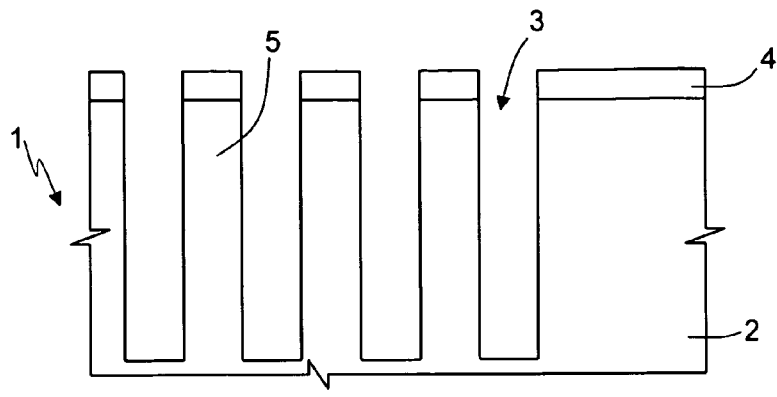
FIGS. 1-3 are cross-sectional views of a wafer of semiconductor material in successive steps of a manufacturing process of a SOI wafer of a known type.
Figure 2:
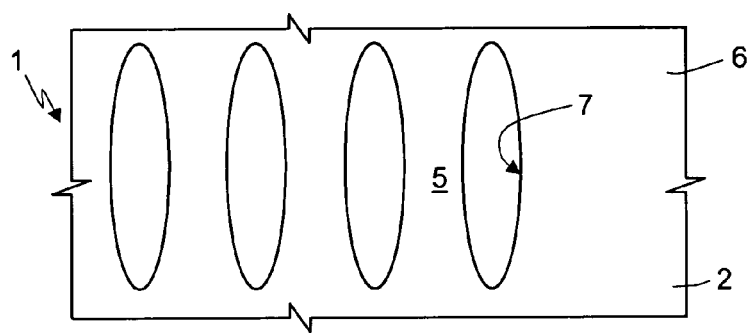
Figure 3:
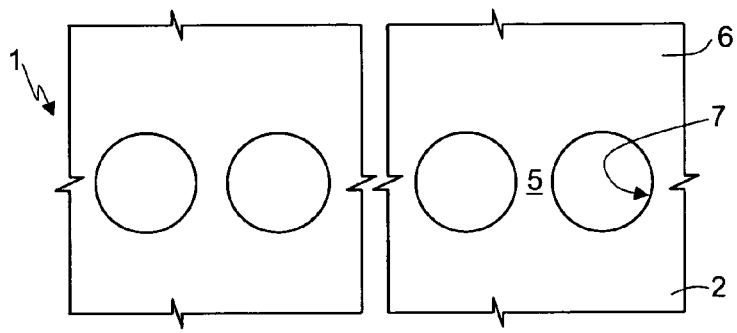
Figure 4:
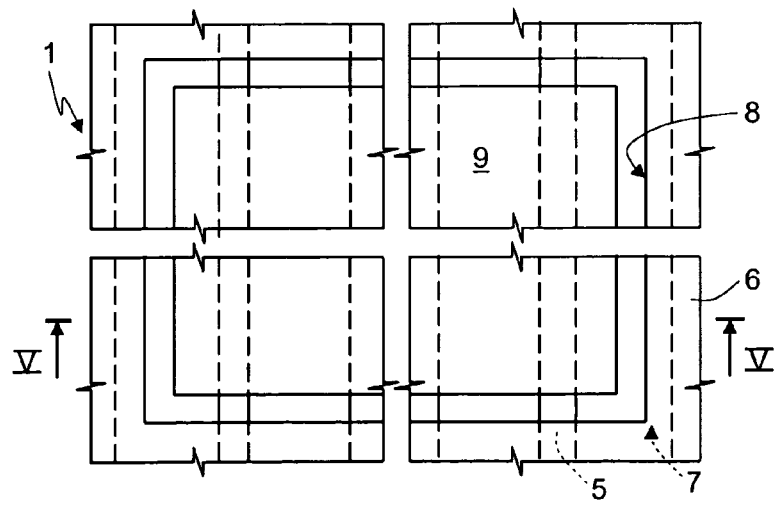
FIG. 4 is a top plan view of the wafer of FIG. 3, in a subsequent step of the manufacturing process.
Figure 5:
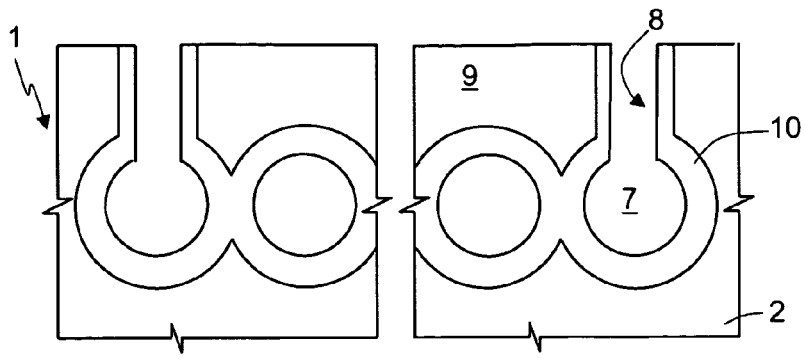
FIG. 5 is a cross-sectional view of the wafer of FIG. 4 taken along the line V-V.
Figure 6:
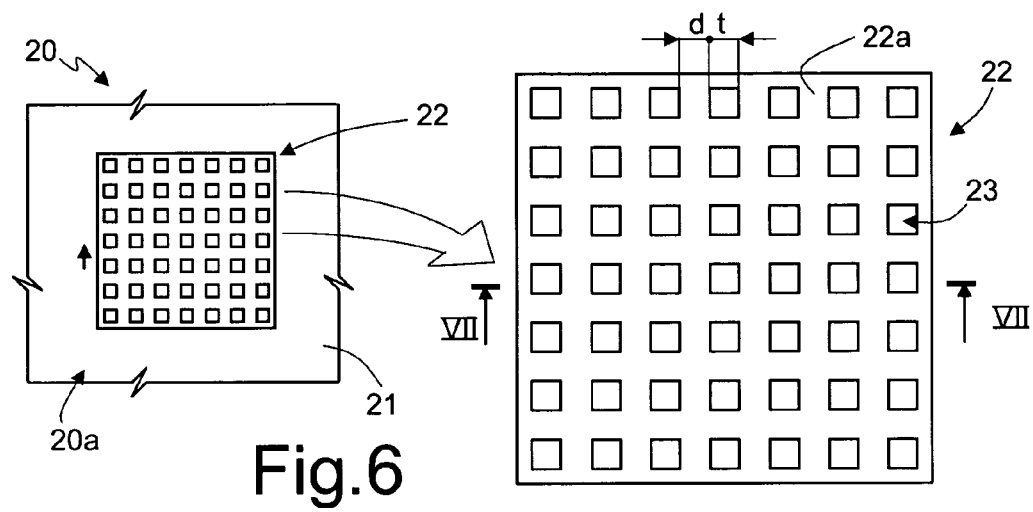
FIG. 6 is a top plan view of a wafer of semiconductor material in an initial step of a manufacturing process of a SOI wafer according to a first embodiment of the present invention.

FIG. 6 (not in scale, like all the following figures) shows a wafer 20 of semiconductor material, for example monocrystalline silicon, comprising a substrate 21, for instance of an N type.

Figure 7:
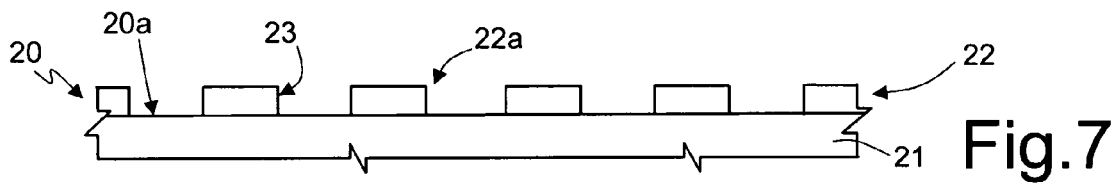
FIG. 7 is a cross-sectional view at an enlarged scale of details of FIG. 6, taken along the line VII-VII.

In an initial step of the manufacturing process according to an embodiment of the invention, a resist layer is deposited on a top surface 20a of the wafer 20, and the resist layer is defined so as to form a mask 22 (see also the cross section of FIG. 7). In detail, the mask 22 has a lattice-shaped structure 22a, extending on an approximately square area (as may be seen in the enlarged detail of FIG. 6) and defining a plurality of openings 23, also having an approximately square shape. For example, the distance t between opposite sides of the openings 23 may be 0.5 µm, and the distance d between facing sides of adjacent openings 23 may also be 0.5 µm.

Figure 8:
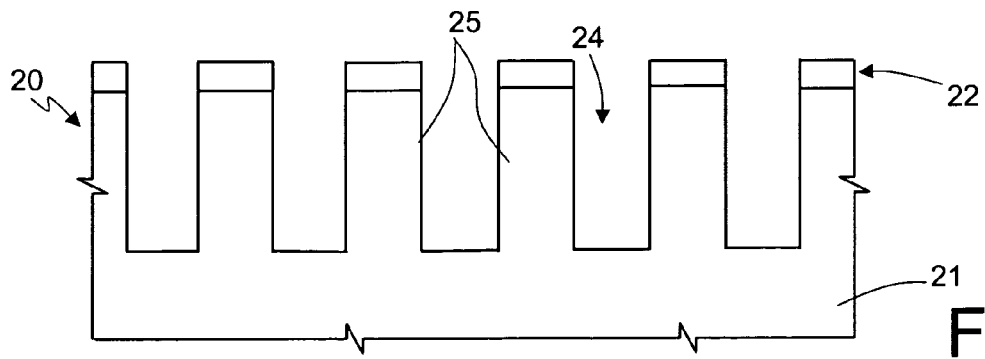
FIGS. 8-10 are cross-sectional views of the wafer of semiconductor material of FIG. 6 in subsequent steps of the manufacturing process according to the first embodiment of the invention.

Using the mask 22 (FIG. 8), an anisotropic etching of the wafer 20 is then performed, following upon which deep trenches 24 are formed at the openings 23. The deep trenches 24 have, for example, a depth of 2 to 2.5 µm, and are separated from one another by walls 25 of semiconductor material, which form together a single separation structure, having a cross section corresponding to that of the structure 22a.

Subsequently, the mask 22 is removed, and an epitaxial growth is performed in a deoxidizing environment (typically, in an atmosphere with a high concentration of hydrogen, for example with trichlorosilane-SiHC$_{13}$). Subsequently (FIG. 9), an epitaxial layer 26, for instance of an N type, grows in a controlled way on top of the walls 25 and closes the deep trenches 24 at the top, entrapping the gas therein. A step of thermal annealing is then performed, for example in a hydrogen atmosphere for 30 minutes at 1190° C., or, alternatively, in a nitrogen atmosphere for 13 hours. In particular, the annealing step causes a migration of the silicon atoms, which tend to migrate into positions of lower energy. Consequently, and also thanks to the relatively small thickness of the walls 25, the silicon atoms migrate completely from the walls 25, and the deep trenches 24 merge together, forming a single buried cavity 27, which is uniform and entirely contained within the substrate 21. For example, the buried cavity 27 has a square cross section with a side of 500 µm and has a thickness of 0.5 µm. A relatively thin layer of semiconductor material (for instance, having a thickness of approximately 1 µm) remains on top of the buried cavity 27, said thin layer being constituted in part by epitaxially grown silicon atoms and in part by migrated silicon atoms. The thin layer forms a membrane surface region 28, which is suspended in a flexible way above the buried cavity 27.

Figure 10:
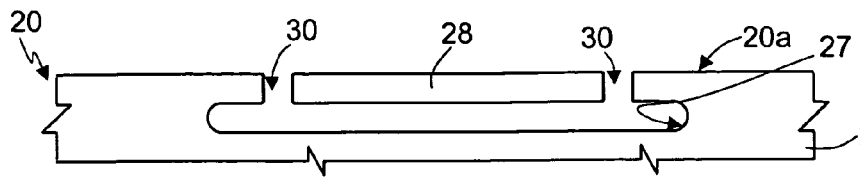
Figure 11:
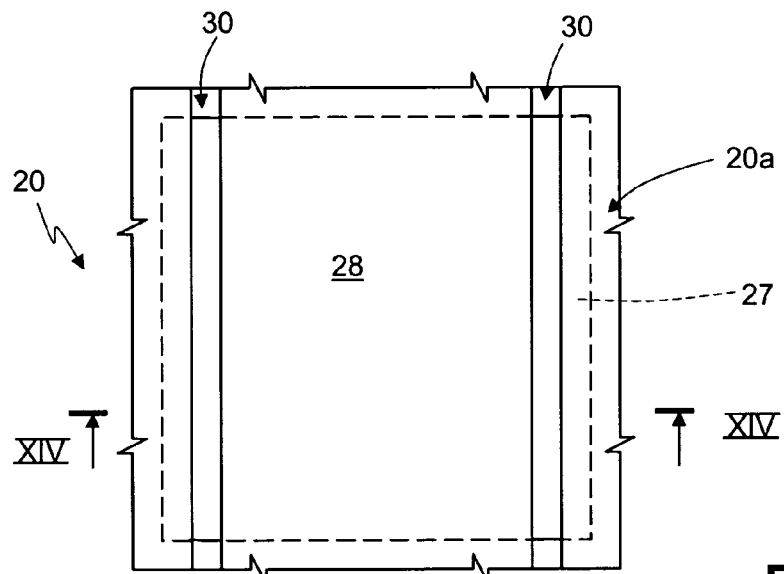
FIG. 11 is a top plan view of the wafer of FIG. 10.

According to a first embodiment of the present invention (FIG. 10), an etching is performed starting from the top surface 20a of the wafer 20 through an appropriate masking so as to form access trenches 30, which extend through the surface region 28 and reach the buried cavity 27. In particular (see also FIG. 11), two access trenches 30 are formed having, for instance, an elongated rectilinear shape and extending parallel to one another, next to, and for the entire length of, two opposite sides of the surface region 28.

Figure 12:
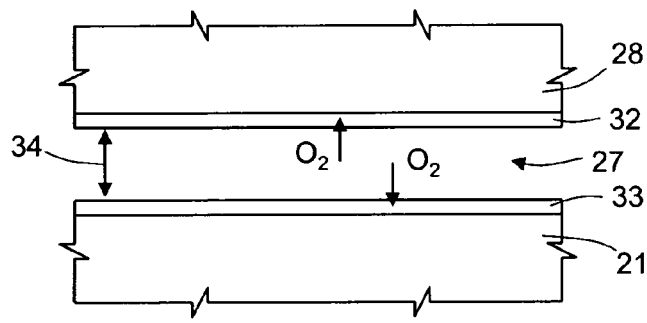
FIGS. 12 and 13 show an enlargement of a portion of a buried cavity of the wafer of FIG. 11 during an oxidation step.
Figure 13:
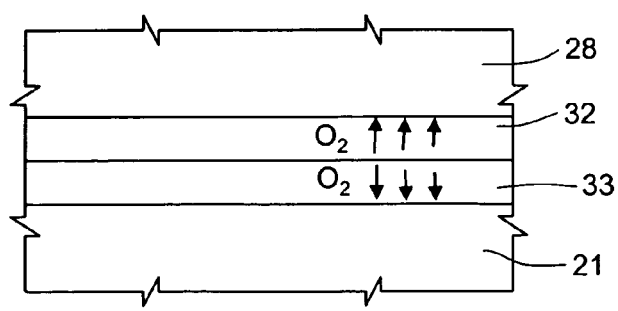

Next, a step of thermal oxidation of the internal walls of the buried cavity 27 is performed by supplying oxygen through the access trenches 30 (for example, at a temperature of 1150 to 1200° C. for 5 to 10 hours). Advantageously, in a way not shown, the masking used for the etching can be maintained in this step to protect the top surface 20a of the wafer 20 from oxidation. In detail, in an initial step of the oxidation process, as shown in FIG. 12, the oxygen atoms react with the silicon atoms at the internal walls of the buried cavity 27, forming a top layer 32 and a bottom layer 33 of silicon oxide, separated by a gap 34. In particular, the top layer 32 grows from silicon atoms of the surface region 28, whilst the bottom layer 33 grows from silicon atoms of the substrate 21. Subsequently, the oxygen atoms diffuse through the top and bottom layers 32, 33 (as highlighted by the arrows in FIG. 12) to react at the interface with the silicon, increasing the thickness of the top and bottom layers 32, 33 and thus reducing the gap 34. In a final stage of the oxidation process (FIG. 13), the top layer 32 and the bottom layer 33 come into contact with one another, and complete closing of the gap 34 occurs. When the top layer 32 and the bottom layer 33 come into contact, oxygen atoms are still diffusing towards the interface with the silicon (as highlighted by the arrows). The further supply of oxide that follows thereon, although limited, determines a pressure in the interface region between the top layer 32 and the bottom layer 33, causing the bonding between the two layers. In particular, it is reasonable to suppose that silicon-bridge bonds (Si—O—Si) are created in a way similar to what occurs, for instance, in the case of bonding between two oxidized wafers.

Figure 14:
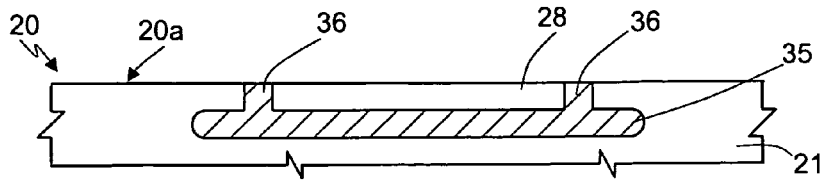
FIG. 14 is a cross-sectional view of the wafer of FIG. 11, taken along the line XIV-XIV, in a final step of the manufacturing process according to the first embodiment of the invention.

Consequently (FIG. 14), at the end of oxidation, a flat, compact and uniform buried-oxide layer 35 is formed within the buried cavity 27, separating the surface region 28 (i.e., the active region of the SOI wafer), from the substrate 21, in this way determining the classic SOI structure. Furthermore, also the access trenches 30 come to be filled with oxide, thus laterally constituting insulating regions 36 for the active region of the SOI wafer. The resulting thickness of the buried-oxide layer 35 is principally a function of the dimensions (depth and width) of the deep trenches 24 and of the walls 25. In particular, with the described process it is possible to obtain a buried-oxide layer 35 having a minimum thickness of approximately 1 µm.

Subsequently, within the surface region 28 (in a known manner which is not illustrated) active or passive components, sensors, or other micro-electromechanical structures are integrated, which can, for instance, be electrically insulated from one another by further trenches having a depth such as to reach the buried-oxide layer 35.

A second embodiment of the present invention again envisages the formation of the surface region 28, suspended above the buried cavity 27 to form a flexible membrane, with the difference that, in this case, the buried-oxide layer 35 is formed with recessed-LOCOS processes.

Figure 9:
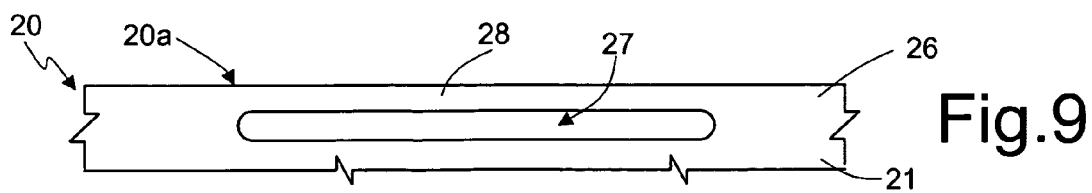
Figure 15:
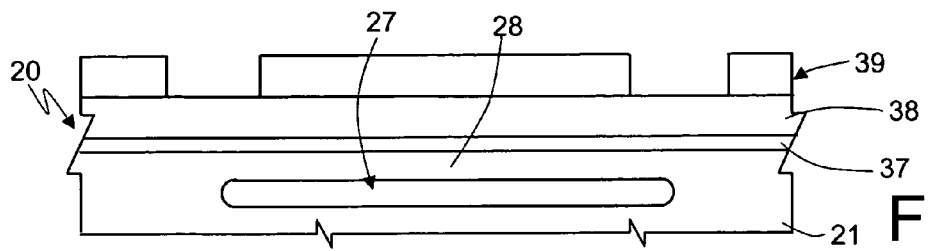
FIG. 15 is a cross-sectional view of a wafer of semiconductor material in a step of a manufacturing process of a SOI wafer in accordance with a second embodiment of the invention.

In detail, following upon the formation of the surface region 28 and of the buried cavity 27 (as shown in FIG. 9), a pad-oxide layer 37 is formed on the top surface 20a of the wafer 20, and on the latter a sacrificial layer 38 of silicon nitride. Then a resist layer is deposited, which is appropriately defined so as to form an etching mask 39 (FIG. 15).

Subsequently (FIGS. 16 and 17), through the etching mask 39, the sacrificial layer 38, the pad-oxide layer 37, and part of the surface region 28 and of the substrate 21 are etched, in sequence. So, a plurality of recesses 40 are opened at the periphery of the surface region 28, each of which extends in part through the surface region 28 and in part through the substrate 21 and has a depth such as to reach the buried cavity 27. In detail, the recesses 40 are aligned at regular intervals along the sides of the surface region 28. Connection bridges 41 of semiconductor material are provided between adjacent recesses 40; the connection bridges 41 connect the surface region 28 to the substrate 21, supporting the surface region 28 over the buried cavity 27 during the etching step.

Next, the recesses 40 are thermally oxidized (recessed-LOCOS process), which leads to the formation of an oxide region, selectively in the areas not covered by the sacrificial layer 38 (for example, oxidation is performed at a temperature of 1100° C. for 3 to 4 hours). In particular, the oxide region has a first portion that fills the inside of the buried cavity 27 uniformly to form the buried-oxide layer 35, and a second portion that fills the recesses 40 to form the insulating region 36. In particular, the insulating region 36 also engulfs the connection bridges 41, which are completely oxidized given their relatively small dimensions, thus completely surrounding and insulating the surface region 28.

Figure 18:
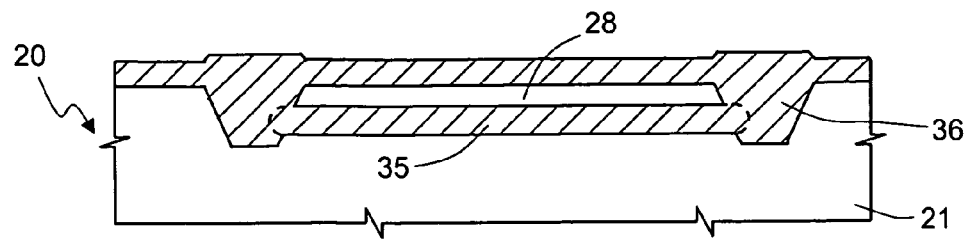

Then, the sacrificial layer 38 is removed to obtain the structure of FIG. 18, where the classic SOI structure is again recognizable. In particular, recessed-LOCOS type oxidation often allows a good surface planarity of the final structure to be achieved.

The above described process embodiments has numerous advantages.

In fact, they often allow high-quality SOI wafers to be obtained with low production costs, in so far as they envisages the use of standard techniques normally used in the semiconductor industry.

In particular, a compact (i.e., without any empty regions) and flat (i.e., without any undulations) buried-oxide layer can be formed. In particular, the surface region 28 has an almost planar bottom surface in contact with the buried-oxide layer 35. The SOI wafers thus obtained may also keep the advantage linked to the elimination of low-frequency parasitics.

In addition, it is possible to achieve a particularly small thickness of the buried-oxide layer, such that said SOI wafers can be advantageously used for the integration of non-power components.

Furthermore, the first embodiment described (thermal oxidation through trenches) can be advantageously applied also in BCD (Bipolar CMOS DMOS) power technologies, wherein a larger thickness of the surface region 28 (in the order of some ten microns) is envisaged, whilst the second embodiment described (recessed-LOCOS oxidation) is particularly advantageous in VLSI (Very Large-Scale Integration) technologies, wherein a smaller thickness of the surface region 28 is envisaged (smaller than a micron).

Finally, it is clear that modifications and variations can be made to what is described and illustrated herein, without thereby departing from the scope of the present invention.

In particular, the structure of the mask 22 and the shape of the walls 25 and of the deep trenches 24 can vary with respect to what is illustrated.

Figure 19:
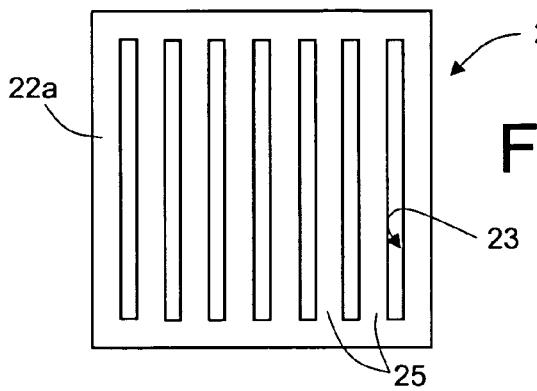
FIGS. 19-21 show different structures of an etching mask which can be used in the manufacturing process according to an embodiment of the invention.

For instance, FIG. 19, the mask 22 can have a structure 22a shaped like a grid, and define openings 23 having a strip-like shape and extending parallel to one another, separated by walls 25 also shaped like strips.

Figure 20:
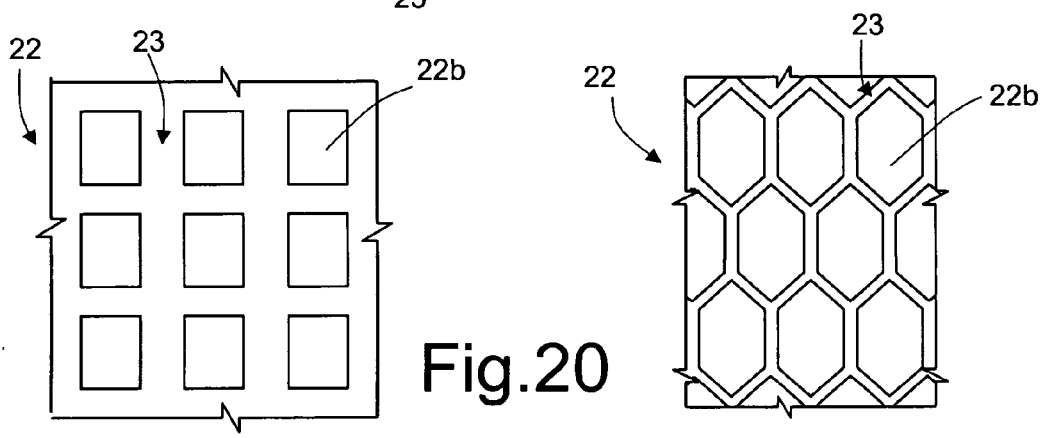
Figure 21:
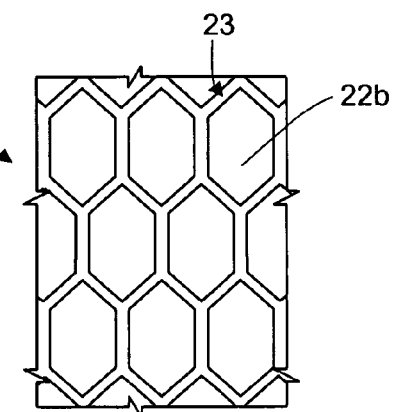

Alternatively, the mask 22 can have a complementary structure with respect to what is illustrated in FIG. 6. In particular (FIGS. 20-21), the mask 22 can comprise a plurality of portions 22b of a polygonal shape (for instance, square or hexagonal), regularly arranged to define a lattice-shaped opening 23 (square or honeycomb-shaped).

More in general, the walls 25 can be relatively thin structures enabling complete migration of the silicon atoms during the annealing step, which leads to the formation of the buried cavity 27.

The masks 22 with lattice-shaped structure are in any case often the best in terms of crystallographic quality of the silicon surface region 28, and hence more advantageous to use in the described manufacturing process.

In addition, the geometrical shape of the surface region 28 can be different; for instance, it may be circular or generically polygonal.

The thickness of the buried-oxide layer 35 can be further reduced to increase the compatibility with integration techniques of the VLSI type. For this purpose, it is possible to scale down even further the dimensions of the mask 22 and in particular to reduce the size of the openings 23. This can be achieved by resorting to higher-performance lithographies, or else to the so-called "self-assembled polymer" technique. As described in detail in "Process integration of self-assembled polymer templates into silicon nanofabrication", K. W. Guarini, et al., J. Vac. Sci. Technol. B 20(6), November/December 2002, which is incorporated by reference, it is possible to obtain the mask 22 starting from a self-assembled polymer film. The blocks of polymers, in fact, organize themselves spontaneously in a lattice of hexagonal pores, having diameters of up to 20 nm and centre-to-centre spacings of up to 42 nm. Said lattice can be deposited on top of the surface 20a of the wafer 20 and used as mask 22 to obtain deep trenches 24 and walls 25 of extremely small dimensions (in the order of a few tens of nanometers). The thickness reduction of the buried-oxide layer 35 allows, among other things, a better thermal dissipation towards the substrate 21 to be achieved.

Figure 22:
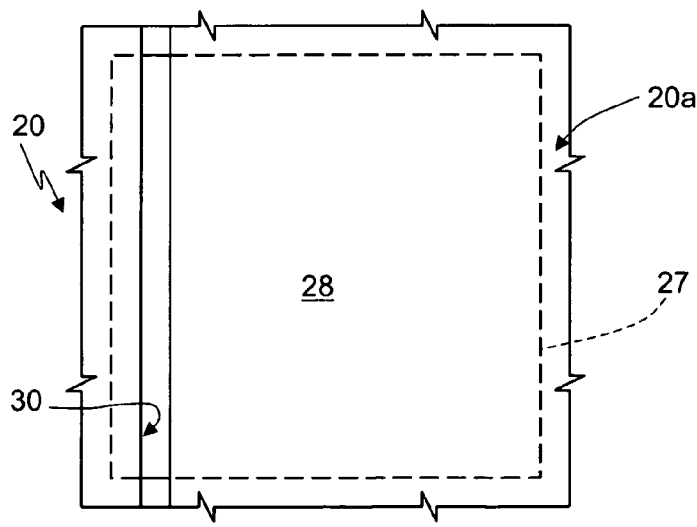
FIG. 22 is a view similar to that of FIG. 11, according to a variation of the first embodiment of the invention.

Furthermore (FIG. 22), according to a variation of the first embodiment, a single access trench 30 is formed next to one of the sides of the surface region 28. Also in this case, it is possible to envisage oxidation of the buried cavity 27 to form the buried-oxide layer 35. Again, the components that will be integrated in the surface region 28 may have to be electrically insulated in an appropriate way, for instance via the formation of further trenches, of a depth such as to reach the buried-oxide layer 35.

Figure 16:
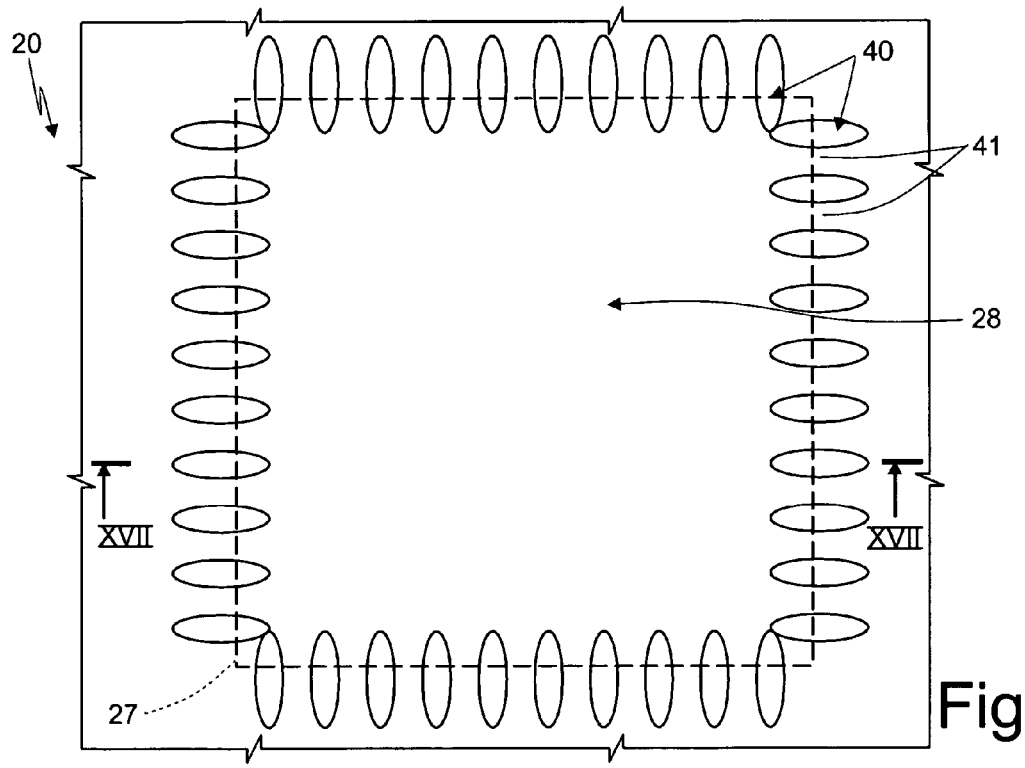
FIG. 16 is a top plan view of the wafer of FIG. 15, in a subsequent step of the manufacturing process according to the second embodiment of the invention.
Figure 17:
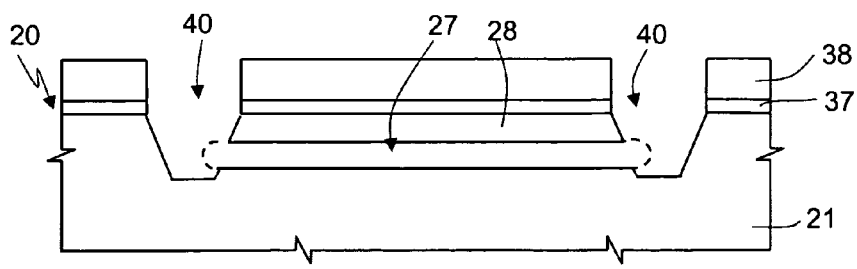
FIGS. 17 and 18 are cross-sectional views of the wafer of FIG. 16, taken along the line XVII-XVII, in successive steps of the manufacturing process according to the second embodiment of the invention.

In particular, simultaneously with the formation of the access trench 30 it is possible to provide, aligned along the remaining sides of the surface region 28, a plurality of recesses 40 alternating with connection bridges 41 (in a way similar to what has been described with reference to FIG. 16) so as to provide, with the subsequent oxidation, a complete insulation of the surface region 28 with respect to the substrate 21.

Moreover, an SOI wafer formed as described above may be scribed into dies, from which integrated circuits (ICs) may be formed. And such an IC may be incorporated into an electronic system such as a computer system.

From the foregoing it will be appreciated that, although specific embodiments of the invention have been described herein for purposes of illustration, various modifications may be made without deviating from the spirit and scope of the invention.

The invention claimed is:

1. Process for manufacturing a SOI wafer, comprising:
    forming, in a monolithic body of semiconductor material having a front face, a plurality of polygonal pillars, each pillar isolated from other pillars at the top side;
    forming a buried cavity, extending at a distance from said front face and delimiting, with said front face, a surface region of said monolithic body, said surface region being surrounded by a bulk region and forming a flexible membrane suspended above said buried cavity;
    forming, through said monolithic body, at least one access passage, which reaches said buried cavity; and
    filling said buried cavity uniformly with an insulating region wherein said insulating region is formed by a single insulating filling material which completely fills the buried cavity;
    wherein said surface region is continuous and formed by a single portion of semiconductor material, and said buried cavity is contained and completely insulated within said monolithic body; and wherein forming at least one access passage is performed after forming a buried cavity.

2. The process according to claim 1, wherein forming a buried cavity comprises:
    digging deep trenches within said monolithic body, delimiting separation structures of semiconductor material;
    growing, starting from said separation structures, a closing layer of semiconductor material, closing at the top said deep trenches; and
    carrying out a thermal treatment such as to cause migration of the semiconductor material of said separation structures, elimination of said separation structures, and transformation of said deep trenches into said buried cavity.

3. The process according to claim 2, wherein said separation structures are connected to one another to form a lattice structure, having a plurality of openings in areas corresponding to said deep trenches.

4. The process according to claim 2, wherein said separation structures are arranged parallel to and alongside one another and are separated by said deep trenches.

5. The process according to claim 2, wherein said separation structures have a polygonal shape and are arranged at regular intervals; said deep trenches being connected together and forming a labyrinthine cavity around said separation structures.

6. The process according to claim 2, wherein digging deep trenches comprises defining a mask above said front face of said monolithic body, and etching said monolithic body through said mask; said mask being made up of a self-assembled polymer film.

7. The process according to claim 1, wherein filling said buried cavity comprises the step of thermal oxidation of internal walls of said buried cavity and internal walls of said at least one access passage so as to form said insulating region; said insulating region comprising a first portion filling said buried cavity and a second portion filling said at least one access passage.

8. The process according to claim 1, wherein forming at least one access passage comprises etching said surface region as far as said buried cavity.

9. The process according to claim 1, further comprising forming a further access passage simultaneously to said at least one access passage; said at least one access passage and said further access passage being formed at opposite peripheral portions of said surface region.

10. The process according to claim 9, wherein said surface region has a polygonal shape, and said at least one access passage and said further access passage extend parallel to, and for the entire length of, opposite sides of said surface region.

11. The process according to claim 1, wherein filling said buried cavity comprises performing a recessed-LOCOS type oxidation.

12. Process for manufacturing a SOI wafer, comprising:
    forming, in a monolithic body of semiconductor material having a front face, a plurality of polygonal pillars, each pillar isolated from other pillars at the top side;
    forming a buried cavity, extending at a distance from said front face and delimiting, with said front face, a surface region of said monolithic body, said surface region being surrounded by a bulk region of the monolithic body and forming a flexible membrane suspended above said buried cavity;
    forming, through said monolithic body, at least one access passage, which reaches said buried cavity;
    filling said buried cavity uniformly with a growing insulating region; and
    providing further access passages simultaneously to said at least one access passage; said at least one access passage and said further access passages being formed along an outer perimeter of said surface region, and being separated from one another by connection structures made of semiconductor material, connecting said surface region to said bulk region;
    wherein forming at least one access passage further comprises etching said bulk region, said at least one access passage extending in part through said surface region and in part through said bulk region.

13. The process according to claim 12, wherein filling said buried cavity further comprises the step of thermal oxidation of said connection structures.

14. A method, comprising:
    forming in a semiconductor substrate at least one recess that includes isolated polygonal pillars;
    forming from the pillars a single continuous cavity in the semiconductor substrate between first and second regions of the substrate;
    forming an opening to the cavity; and
    growing a single uniform insulator in the cavity such that the insulator completely fills the cavity via the opening such that the insulator electrically isolates the first region of the substrate from the second region of the substrate.

15. The method of claim 14 wherein forming a cavity comprises:
    growing an epitaxial layer over the substrate to close the at least one recess; and
    heating the substrate to form the single continuous cavity.

16. The method of claim 14 wherein forming a cavity comprises:
    growing an epitaxial layer over the pillars to close the at least one recess; and
    removing the pillars to form the single continuous cavity.

17. The method of claim 14 wherein forming the opening comprises etching in the substrate at least one trench that connects with the cavity.

18. The method of claim 14 wherein forming the insulator comprises growing the insulator in the cavity and in the opening.

19. The method of claim 14 wherein forming the insulator comprises oxidizing walls of the cavity and opening.

20. The method of claim 14 wherein forming the insulator comprises filling the cavity with the insulator such that the filled cavity has substantially no voids.

21. The method of claim 14 wherein forming the cavity comprises forming a substantially flat boundary between the cavity and at least one of the first and second regions.

22. A method, comprising:
 forming in a semiconductor substrate at least one recess that defines a lattice of polygonal regions;
 forming from the lattice a single continuous cavity in the semiconductor substrate between first and second regions of the substrate;
 forming an opening to the cavity; and
 growing a single uniform insulator in the cavity such that the insulator completely fills the cavity via the opening such that the insulator electrically isolates the first region of the substrate from the second region of the substrate.

23. The method of claim 22 wherein forming the lattice of regions comprises forming a lattice of polygonal trenches.

24. The method of claim 22 wherein forming the lattice of regions comprises forming a lattice of hexagonal trenches.

25. The method of claim 22 wherein forming the lattice of regions comprises forming a lattice of circular pillars.

26. Process for manufacturing a SOI wafer, comprising:
 forming, in a monolithic body of semiconductor material having a front face, a plurality of polygonal pillars;
 forming a buried cavity, extending at a distance from said front face and delimiting, with said front face, a surface region of said monolithic body, said surface region being surrounded by a bulk region and forming a flexible membrane suspended above said buried cavity;
 forming, through said monolithic body, at least one access passage, which reaches said buried cavity; and
 filling, completely, said buried cavity uniformly with a grown single insulating region;
 wherein said surface region is continuous and formed by a single portion of semiconductor material, and said buried cavity is contained and completely insulated within said monolithic body; and wherein forming at least one access passage is performed after forming a buried cavity.

27. The process of claim 26 wherein filling further comprises a single thermal oxidation step that includes oxidation of internal walls of the buried cavity so as to progressively grow layers of the insulating material from the internal walls.

28. The process of claim 26, further comprising stopping the thermal oxidation step after bonding between the layers results in a uniform filling of the buried cavity by the bonded layers.

29. A method, comprising:
 forming, in a monolithic body of semiconductor material having a front face, a plurality of pillars;
 forming a buried cavity, extending at a distance from the front face and delimiting, with the front face, a surface region of the monolithic body, said surface region being surrounded by a bulk region of the monolithic body and forming a flexible membrane suspended above the buried cavity;
 forming, through the monolithic body, a plurality of access passages to the buried cavity, the access passages being formed along an outer perimeter of said surface region, and being separated from one another by connection structures made of semiconductor material, connecting the surface region to the bulk region; and
 completely filling the buried cavity with a grown single uniform insulating layer.

30. The method of claim 29 wherein forming the plurality of access passages further comprises etching the bulk region, each access passage extending in part through the surface region and in part through the bulk region.

* * * * *

UNITED STATES PATENT AND TRADEMARK OFFICE
CERTIFICATE OF CORRECTION

| | | |
|---|---|---|
| PATENT NO. | : 7,846,811 B2 | Page 1 of 1 |
| APPLICATION NO. | : 11/448589 | |
| DATED | : December 7, 2010 | |
| INVENTOR(S) | : Flavio Francesco Villa et al. | |

It is certified that error appears in the above-identified patent and that said Letters Patent is hereby corrected as shown below:

In Claim 1, Column 7, Line 29 of the patent, "said monolithic body; and wherein forming at least one" should read --said monolithic body; and
wherein forming at least one--

In Claim 12, Column 8, Line 29 of the patent, "filling said buried cavity uniformly with a growing insulating" should read --filling said buried cavity uniformly with a grown insulating--

In Claim 26, Column 10, Line 8 of the patent, "said monolithic body; and wherein forming at least one" should read --said monolithic body; and
wherein forming at least one--

Signed and Sealed this
Twenty-ninth Day of March, 2011

David J. Kappos
*Director of the United States Patent and Trademark Office*